(12) United States Patent
Yang

(10) Patent No.: US 7,170,118 B2
(45) Date of Patent: Jan. 30, 2007

(54) FIELD EFFECT TRANSISTOR (FET) DEVICE HAVING CORRUGATED STRUCTURE AND METHOD FOR FABRICATION THEREOF

(75) Inventor: Fu-Liang Yang, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/632,379

(22) Filed: Aug. 1, 2003

(65) Prior Publication Data
US 2005/0023569 A1 Feb. 3, 2005

(51) Int. Cl.
H01L 29/80 (2006.01)
H01L 31/112 (2006.01)

(52) U.S. Cl. ............... 257/286; 257/317; 257/E29.028

(58) Field of Classification Search ............... 257/288, 257/289, 314, 347, 309, 317, 401, 404, 342, 257/278, 327, 285, 286, 287, 249, 284, 773, 257/E29.028; 438/147, 260
See application file for complete search history.

(56) References Cited

U.S. PATENT DOCUMENTS

| | | | |
|---|---|---|---|
| 5,023,671 A | * | 6/1991 | DiVincenzo et al. ........ 257/183 |
| 5,119,151 A | | 6/1992 | Onda |
| 5,365,078 A | * | 11/1994 | Hayashi et al. ............... 257/24 |
| 6,218,701 B1 | * | 4/2001 | Semple et al. ............... 257/342 |
| 6,274,896 B1 | * | 8/2001 | Gibson et al. ............... 257/259 |
| 6,677,202 B2 | * | 1/2004 | Semple et al. ............... 438/260 |

OTHER PUBLICATIONS

Sallagoity et al, "Analysis of Width Edge Effects in Advanced Isolation Schemes for Deep Submicron CMOS Technologies", IEEE Trans. on Electron Devices, 44(11), Nov. 1996, pp. 1900-1905.
Matsuda et al, Novel Corner Rounding Process of Shallow Trench Isolation Utilizing MSTS (Micro-Structure Transformation of silicon). IEEE IEDM98, pp. 137-140.

* cited by examiner

Primary Examiner—B. William Baumeister
Assistant Examiner—Dana Farahani
(74) Attorney, Agent, or Firm—Tung & Associates

(57) ABSTRACT

Within both a field effect transistor (FET) device and a method for fabricating the field effect transistor (FET) device there is provided: (1) a semiconductor substrate; (2) a gate electrode formed over the semiconductor substrate and covering a channel region within the semiconductor substrate; and (3) a pair of source/drain regions formed within the semiconductor substrate and separated by the channel region within the semiconductor substrate. Within both the field effect transistor (FET) device and the method for fabricating the field effect transistor (FET) device, at least one of: (1) an interface of the channel region covered by the gate electrode; and (2) an upper surface of the gate electrode, is corrugated.

20 Claims, 2 Drawing Sheets

FIELD EFFECT TRANSISTOR (FET) DEVICE HAVING CORRUGATED STRUCTURE AND METHOD FOR FABRICATION THEREOF

BACKGROUND OF THE INVENTION

1. Field of the Invention

The present invention relates generally to methods for fabricating field effect transistor (FET) devices within semiconductor integrated circuit microelectronic fabrications. More particularly, the present invention relates to methods for fabricating, with enhanced performance, field effect transistor (FET) devices within semiconductor integrated circuit microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly important within the art of microelectronic fabrication, and in particular within the art of semiconductor integrated circuit microelectronic fabrication, to fabricate microelectronic devices, and in particular semiconductor integrated circuit microelectronic devices, such as but not limited to field effect transistor (FET) device semiconductor integrated circuit microelectronic devices, with enhanced performance within decreased microelectronic fabrication substrate area within microelectronic fabrications, and in particular within decreased semiconductor integrated circuit microelectronic fabrication substrate area within semiconductor integrated circuit microelectronic fabrications.

While microelectronic devices fabricated with enhanced performance within decreased microelectronic fabrication substrate area within microelectronic fabrications are clearly desirable in the art of microelectronic fabrication, microelectronic devices fabricated with enhanced performance within decreased microelectronic fabrication substrate area within microelectronic fabrications are nonetheless not readily fabricated entirely without problems within the art of microelectronic fabrication. In that regard, it is often difficult to fabricate microelectronic devices with enhanced performance within decreased microelectronic fabrication substrate area within microelectronic fabrications insofar as microelectronic device performance is often fundamentally compromised within a microelectronic device fabricated within decreased microelectronic fabrication substrate area within a microelectronic fabrication.

It is thus desirable in the art of microelectronic fabrication to provide methods and materials through which there may be fabricated with enhanced performance within microelectronic fabrications microelectronic devices within decreased microelectronic fabrication substrate area within microelectronic fabrications.

It is towards the foregoing object that the present invention is directed.

Various microelectronic structures having desirable properties, and methods for fabrication thereof, have been disclosed in the art of microelectronic fabrication.

For example: (1) DiVincenzo et al., in U.S. Pat. No. 5,023,671; and (2) Onda, in U.S. Pat. No. 5,119,151, each disclose a quantum mechanical field effect transistor (FET) device fabricated within a semiconductor integrated circuit microelectronic fabrication to provide a one-dimensional carrier gas flow within a modulation doped quantum well structure within the quantum mechanical field effect transistor (FET) device fabricated within the semiconductor integrated circuit microelectronic fabrication, rather than a more conventional two-dimensional carrier gas flow within the modulation doped quantum well structure within the quantum mechanical field effect transistor (FET) device fabricated within the semiconductor integrated circuit microelectronic fabrication. To realize the foregoing result: (1) DiVincenzo et al. employ when forming the modulation doped quantum well structure: (a) a first layer formed of a comparatively narrow bandgap compound semiconductor material; having formed thereupon (b) a longitudinal edge patterned second layer formed of a comparatively wide bandgap compound semiconductor material; while (2) Onda employs when forming the modulation doped quantum well structure: (a) a first layer formed of a first compound semiconductor material; having formed thereupon (b) a second layer formed of a second compound semiconductor material; in turn having formed thereupon (c) an etch stop layer formed of a third compound semiconductor material; finally in turn having formed thereupon (d) a patterned electron supply layer formed of a fourth compound semiconductor material.

In addition: (1) Sallagoity et al., in "Analysis of Width Edge Effects in Advanced Isolation Schemes for Deep Submicron CMOS Technologies," IEEE Trans. on Electron Devices, 44(11), November 1996, pp. 1900–05; and (2) and Matsuda et al., in "Novel Corner Rounding Process for Shallow Trench Isolation utilizing MSTS (Micro-Structure Transformation of Silicon), IEEE IEDM 98, pp. 137–40, disclose effects of isolation region to active region semiconductor substrate geometric transition with respect to field effect transistor (FET) device performance for a field effect transistor (FET) device fabricated within an active region of a semiconductor substrate adjoining an isolation region formed within the semiconductor substrate. Both Sallagoity et al. and Matsuda et al. disclose the onset of parasitic effects within such a field effect transistor (FET) device formed within the active region of the semiconductor substrate adjoining the isolation region formed within the semiconductor under conditions where the active region of the semiconductor substrate is formed with a sharp corner adjoining the isolation region formed within the semiconductor substrate, such that rounding of the sharp corner within the active region of the semiconductor substrate is desirable in order to minimize the parasitic effects.

Desirable in the art of microelectronic fabrication are additional methods and materials through which there may be fabricated with enhanced performance within microelectronic fabrications microelectronic devices within decreased microelectronic substrate area within microelectronic fabrications.

It is towards the foregoing object that the present invention is directed.

SUMMARY OF THE INVENTION

A first object of the present invention is provide within a microelectronic fabrication a microelectronic device, and a method for fabricating the microelectronic device.

A second object of the present invention is to provide the microelectronic device, and the method for fabricating the microelectronic device, in accord with the first object of the present invention, wherein the microelectronic device is fabricated with enhanced performance within a decreased microelectronic fabrication substrate area within the microelectronic fabrication.

A third object of the present invention is to provide the microelectronic device, and the method for fabricating the microelectronic device, in accord with the first object of the present invention and the second object of the present invention, wherein the method for fabricating the microelectronic device is readily commercially implemented.

In accord with the objects of the present invention, there is provided by the present invention a field effect transistor (FET) device and a method for fabricating the field effect transistor device.

In accord with the present invention, the field effect transistor (FET) device of the present invention comprises in a first instance a semiconductor substrate. The field effect transistor (FET) device of the present invention also comprises a gate electrode formed over the semiconductor substrate and covering a channel region within the semiconductor substrate. Finally, the field effect transistor (FET) device of the present invention also comprises a pair of source/drain regions formed within the semiconductor substrate and separated by the channel region within the semiconductor substrate, wherein at least one of: (1) an interface of the channel region covered by the gate electrode; and (2) an upper surface of the gate electrode, is corrugated.

The field effect transistor (FET) device of the present invention contemplates a general method for fabricating the field effect transistor (FET) device of the present invention, as well as a plurality of subsidiary methods for fabricating the field effect transistor (FET) device of the present invention.

The present invention provides within a microelectronic fabrication a microelectronic device, and a method for fabricating the microelectronic device, wherein the microelectronic device is fabricated with enhanced performance within a decreased microelectronic fabrication substrate area within the microelectronic fabrication.

The present invention realizes the foregoing object by employing when fabricating within a semiconductor integrated circuit microelectronic fabrication a field effect transistor (FET) device comprising: (1) a semiconductor substrate; (2) a gate electrode formed over the semiconductor substrate and covering a channel region within the semiconductor substrate; and (3) a pair of source/drain regions formed within the semiconductor substrate and separated by the channel region within the semiconductor substrate: (1) an interface of the channel region covered by the gate electrode; and (2) an upper surface of the gate electrode, at least one of which is corrugated.

The method of the present invention is readily commercially implemented.

The present invention employs methods and materials as are generally known in the art of semiconductor integrated circuit microelectronic fabrication, but employed at least in part within the context of a specific process ordering to provide the field effect transistor (FET) device in accord with the present invention. Since it is thus at least in part a specific process ordering which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides within a microelectronic fabrication a microelectronic device, and a method for fabricating the microelectronic device, wherein the microelectronic device is fabricated with enhanced performance within a decreased microelectronic fabrication substrate area within the microelectronic fabrication.

The present invention realizes the foregoing object by employing when fabricating within a semiconductor integrated circuit microelectronic fabrication a field effect transistor (FET) device which comprises: (1) a semiconductor substrate; (2) a gate electrode formed over the semiconductor substrate and covering a channel region within the semiconductor substrate; and (3) a pair of source/drain regions formed within the semiconductor substrate and separated by the channel region within the semiconductor substrate: (1) an interface of the channel region covered by the gate electrode; and (2) an upper surface of the gate electrode, at least one of which is corrugated.

The present invention may be employed for fabricating within semiconductor integrated circuit microelectronic fabrications field effect transistor (FET) devices including but not limited to metal semiconductor field effect transistor (MESFET) devices (which do not include a gate dielectric layer) and metal oxide semiconductor field effect transistor (MOSFET) devices (which do include a gate dielectric layer).

Figure 1:
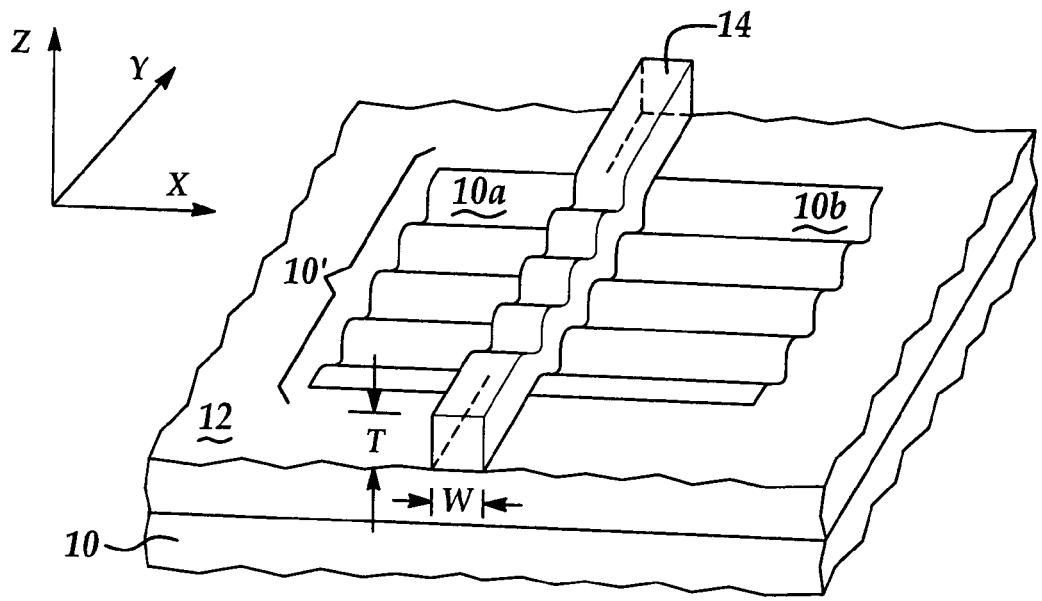
FIG. 1 shows a schematic isometric diagram of a field effect transistor (FET) device fabricated in accord with a preferred embodiment of the present invention.

Referring now to FIG. 1, there is shown a schematic isometric diagram of a field effect transistor (FET) device which may be fabricated in accord with the preferred embodiment of the present invention.

Shown in FIG. 1 is a semiconductor substrate 10 having formed therein and thereupon an isolation region 12 which defines an active region 10' of the semiconductor substrate 10. As is also shown within the schematic cross-sectional diagram of FIG. 1, there is a gate electrode 14 formed over the active region 10' of the semiconductor substrate 10 and bridging to the isolation region 12, where, as is understood by a person skilled in the art, the gate electrode 14 covers, and typically defines, a channel region within the active region 10' of the semiconductor substrate 10. There is also shown within the schematic isometric diagram of FIG. 1 and formed within the active region 10' of the semiconductor substrate 10 a pair of source/drain regions 10a and 10b which is separated by the channel region within the active region 10' of the semiconductor substrate 10 as covered by, and typically defined by, the gate electrode 14. Within the schematic isometric diagram of FIG. 1, the gate electrode 14 typically and preferably has a linewidth W in a lateral X direction of from about 0.01 to about 1 microns, a thickness T in a vertical Z direction of from about 500 to about 2000 angstroms and a length (not specifically designated) in the longitudinal Y direction of from about 0.2 to about 10 microns.

As is also illustrated within the schematic isometric diagram of FIG. 1, and at least in part in accord with the present invention, at least one of: (1) an interface of the channel region covered by the gate electrode 14; and (2) an upper surface of the gate electrode 14, is corrugated. More particularly, and as is specifically illustrated within the schematic isometric diagram of FIG. 1, both: (1) the interface of the channel region covered by the gate electrode 14; and (2) the upper surface of the gate electrode 14, are corrugated. Although the present invention does not preclude a bidirectional areal corrugation of at least one of: (1) the interface of the channel region covered by the gate electrode 14; and (2) the upper surface of the gate electrode 14, such is typically not effected within the context of the present invention insofar as the linewidth W of the gate electrode 14 is typically at or near a registration tolerance of a photolithographic tool employed for forming the gate electrode 14.

Typically and preferably, the corrugation of the at least one of: (1) the interface of the channel region covered by the gate electrode 14; and (2) the upper surface of the gate electrode 14, is provided with: (1) a longitudinal Y direction peak-to-peak periodicity length of from about 0.02 to about 0.4 microns; and (2) a vertical Z direction peak-to-valley depth of from about 100 to about 1000 angstroms.

As is understood by a person skilled in the art, the field effect transistor (FET) device whose schematic isometric diagram is illustrated within FIG. 1 may be fabricated in general employing methods and materials as are generally known in the art of semiconductor integrated circuit microelectronic fabrication, but wherein in contrast with more conventional field effect transistor (FET) devices, within the field effect transistor (FET) device whose schematic cross-sectional diagram is illustrated in FIG. 1 at least one of (and preferably both of): (1) the interface of the channel region covered by the gate electrode 14; and (2) the upper surface of the gate electrode 14, is corrugated. Such methods as are generally known in the art of semiconductor integrated circuit microelectronic fabrication will typically and preferably employ the gate electrode 14 as a mask within an ion implantation method employed for forming within the active region 10' of the semiconductor substrate 10 the pair of source/drain regions 10a and 10b.

Figure 2:
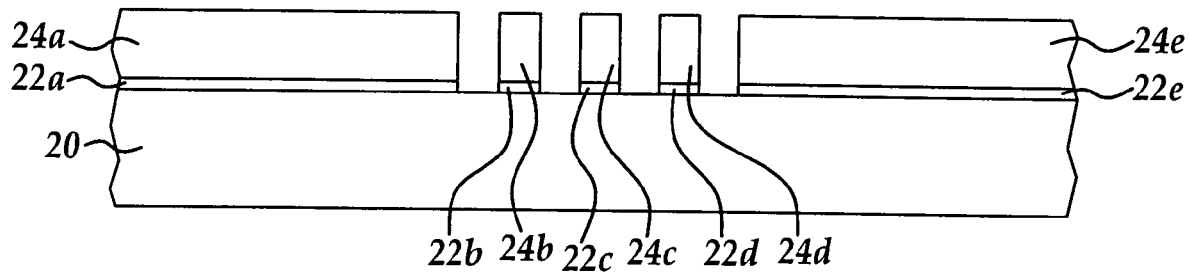
FIG. 2, FIG. 3, FIG. 4, FIG. 5, FIG. 6, FIG. 7 and FIG. 8 show a series of schematic cross-sectional diagrams illustrating the results of progressive stages in forming, in accord with the preferred embodiment of the present invention, the field effect transistor (FET) device fabricated in accord with the preferred embodiment of the present invention.

Referring now to FIG. 2 to FIG. 8, there is show a series of schematic cross-sectional diagrams illustrating the results of progressive stages of forming, in accord with a preferred embodiment of the present invention, a field effect transistor (FET) device within a semiconductor integrated circuit microelectronic fabrication in accord with the preferred embodiment of the present invention. For purposes of correlation within the context of the preferred embodiment of the present invention, the schematic cross-sectional diagrams of FIG. 2 to FIG. 8 are intended to correspond with a cross-section of the semiconductor integrated circuit microelectronic fabrication whose schematic isometric diagram is illustrated in FIG. 1 taken in the longitudinal Y direction and including a vertical cross-section of the gate electrode 14 and the channel region of the active region 10' of the semiconductor substrate 10 covered, and preferably defined, therebeneath. Shown in FIG. 2 is a schematic cross-sectional diagram of the semiconductor integrated circuit microelectronic fabrication at an early stage in fabrication therein of the field effect transistor (FET) device in accord with the preferred embodiment of the present invention.

Shown in FIG. 2 is a silicon semiconductor substrate 20 having formed thereupon a series of patterned pad oxide layers 22a, 22b, 22c, 22d and 22e in turn having formed and aligned co-extensive thereupon a series of patterned silicon nitride layers 24a, 24b, 24c, 24d and 24e. Within the preferred embodiment of the present invention, and as will be illustrated in further detail below, the series of patterned pad oxide layers 22a, 22b, 22c, 22d and 22e, and the series of patterned silicon nitride layers 24a, 24b, 24c, 24d and 24e serve as a series of masking layers.

Although the preferred embodiment of the present invention illustrates the present invention within the context of the silicon semiconductor substrate 20, the present invention is also applicable to forming field effect transistor (FET) devices within semiconductor substrates including but not limited to silicon semiconductor substrates and semiconductor substrates other than silicon semiconductor substrates, such semiconductor substrates other than silicon semiconductor substrates including but not limited to compound semiconductor substrates, although within the context of semiconductor substrates other than silicon semiconductor substrates there will typically and preferably be employed masking layers formed of materials other than silicon oxide materials and silicon nitride materials. Similarly, the present invention is particularly useful for fabricating field effect transistor (FET) devices other than quantum mechanical field effect transistor (FET) devices as are disclosed in greater detail within the related art references cited within the Description of the Related Art, the disclosures of all of which related art references are incorporated herein fully by reference.

Within the preferred embodiment of the present invention with respect to the silicon semiconductor substrate 20, and although silicon semiconductor substrates are known in the art with either dopant polarity, several dopant concentrations and various crystallographic orientations, for the preferred embodiment of the present invention, the silicon semiconductor substrate is typically and preferably a (100) silicon semiconductor substrate having an N- or P- dopant concentration of from about 1E12 to about 1E17 dopant atoms per cubic centimeter.

Within the preferred embodiment of the present invention with respect to the series of patterned pad oxide layers 22a, 22b, 22c, 22d and 22e, and although it is known in the art of semiconductor integrated circuit microelectronic fabrication that pad oxide layers may be formed employing methods including but not limited to pad oxide layer thermal growth methods and pad oxide layer deposition/patterning methods, for the preferred embodiment of the present invention the series of patterned pad oxide layers 22a, 22b, 22c, 22d and 22e is typically and preferably formed employing a pad oxide layer thermal growth method, followed by an appropriate anisotropic etch method, to form the series of patterned pad oxide layers 22a, 22b, 22c, 22d and 22e of silicon oxide of thickness from about 40 to about 200 angstroms formed upon the silicon semiconductor substrate 20.

Within the preferred embodiment of the present invention with respect to the series of patterned silicon nitride layers 24a, 24b, 24c, 24d and 24e, and although it is also known in the art of semiconductor integrated circuit microelectronic fabrication that silicon nitride layers may be formed employing methods including but not limited to chemical vapor deposition (CVD) methods, plasma enhanced chemical vapor deposition (PECVD) methods and physical vapor deposition (PVD) sputtering methods, for the preferred embodiment of the present invention, the series of patterned silicon nitride layers 24a, 24b, 24c, 24d and 24e is typically and preferably formed employing a chemical vapor deposition (CVD) method, in conjunction with an appropriate anisotropic etch method, to form the series of patterned silicon nitride layers 24a, 24b, 24c, 24d and 24e each of thickness from about 500 to about 2000 angstroms formed and aligned upon each of the corresponding series of patterned pad oxide layers 22a, 22b, 22c, 22d and 22e.

Figure 3:
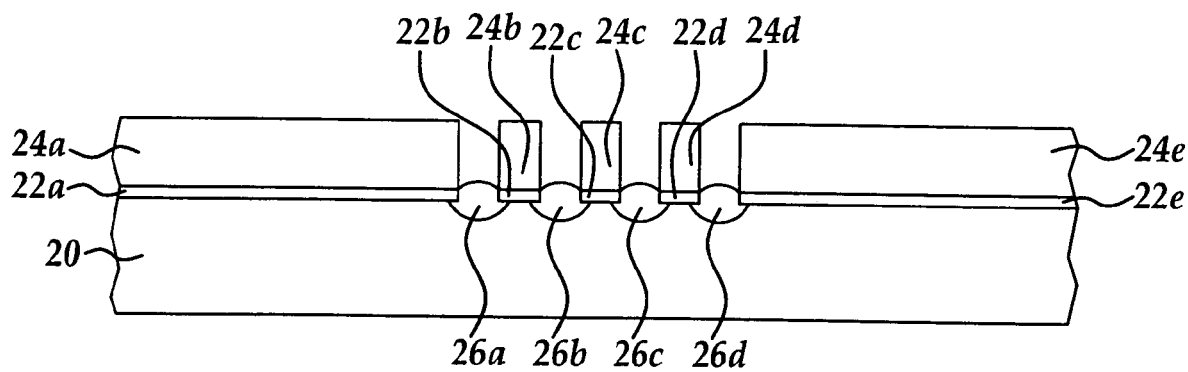

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the silicon semiconductor substrate 20 has been thermally annealed within a thermal annealing environment to provide a series of thermally grown patterned silicon oxide layers 26a, 26b, 26c and 26d within the silicon semiconductor substrate 20 and interposed between the series of patterned pad oxide layers 22a, 22b, 22c, 22d and 22e, as well as the series of patterned silicon nitride layers 24a, 24b, 24c, 24d and 24e, while extending laterally beneath the series of patterned pad oxide layers 22a, 22b, 22c, 22d and 22e.

Within the preferred embodiment of the present invention, the thermal annealing environment which is employed for forming within the silicon semiconductor substrate 20 the series of thermally grown patterned silicon oxide layers 26a, 26b, 26c and 26d interposed between the series of patterned pad oxide layers 22a, 22b, 22c, 22d and 22e having formed aligned thereupon the series of patterned silicon nitride layers 24a, 24b, 24c, 24d and 24e and extending beneath the series of patterned pad oxide layers 22a, 22b, 22c, 22d and 22e is typically and preferably provided as an oxidizing thermal annealing environment at a temperature of from about 700 to about 1100 degrees centigrade for a time period of from about 1 to about 180 minutes, to provide the series of thermally grown patterned silicon oxide layers 26a, 26b, 26c and 26d of thickness from about 100 to about 1000 angstroms and with a curvature generally as illustrated within the schematic cross-sectional diagram of FIG. 3 extending beneath the series of patterned pad oxide layers 22a, 22b, 22c, 22d and 22e.

Figure 4:
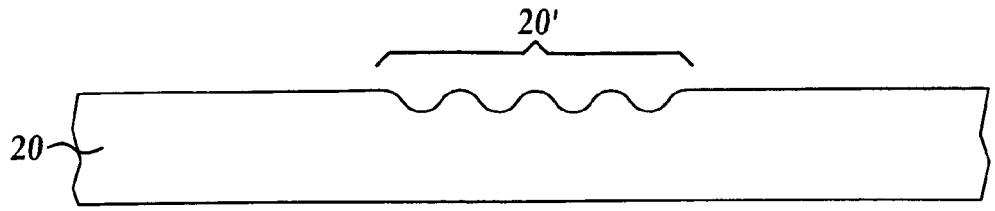

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there has been sequentially stripped from the semiconductor integrated circuit microelectronic fabrication: (1) the series of patterned silicon nitride layers 24a, 24b, 24c, 24d and 24e from the series of patterned pad oxide layers 22a, 22b, 22c, 22d and 22e; and (2) the series of patterned pad oxide layers 22a, 22b, 22c, 22d and 22e, in conjunction with the series of thermally grown patterned silicon oxide layers 26a, 26b, 26c and 26d, from the silicon semiconductor substrate 20, to provide the silicon semiconductor substrate 20 as illustrated within the schematic cross-sectional diagram of FIG. 4 having a corrugated region 20' formed therein.

To form from the semiconductor integrated circuit microelectronic fabrication whose schematic cross-sectional diagram is illustrated in FIG. 3 the semiconductor integrated circuit microelectronic fabrication whose schematic cross-sectional diagram is illustrated in FIG. 4: (1) the series of patterned silicon nitride layers 24a, 24b, 24c, 24d and 24e may be stripped from the series of patterned pad oxide layers 22a, 22b, 22c, 22d and 22e while employing an aqueous phosphoric acid etchant at an elevated temperature of from about 25 to about 250 degrees centigrade; and (2) the series of patterned pad oxide layers 22a, 22b, 22c, 22d and 22e, in conjunction with the series of thermally grown patterned silicon oxide layers 26a, 26b, 26c and 26d, may be stripped from the silicon semiconductor substrate 20 while employing a hydrofluoric acid etchant or a buffered oxide etchant.

Figure 5:
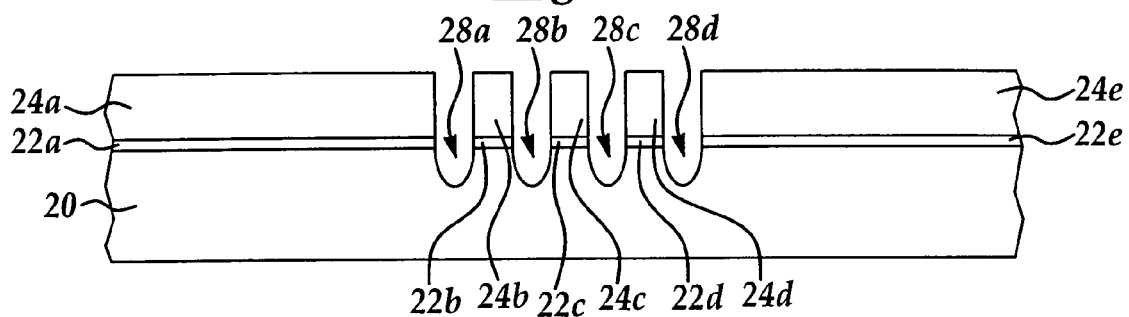
Figure 6:
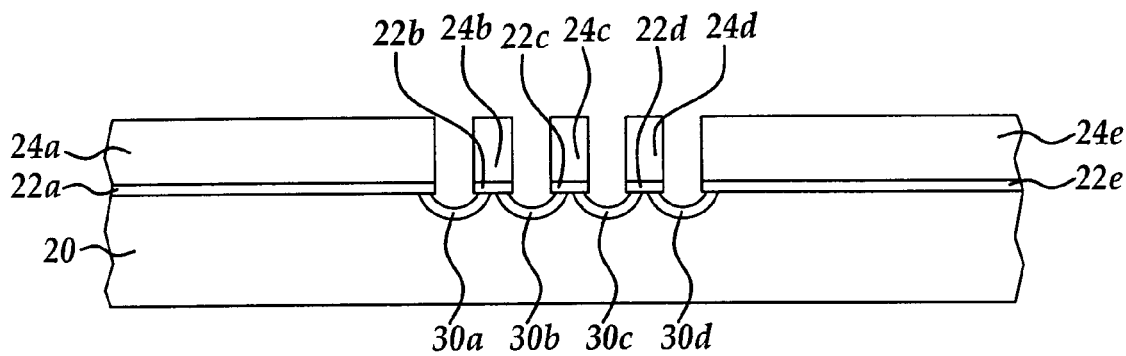

Referring now to FIG. 5 and FIG. 6, there is shown a pair of schematic cross-sectional diagrams illustrating the results of alternative processing of the semiconductor integrated circuit microelectronic fabrication whose schematic cross-sectional diagram is illustrated in FIG. 2 to also provide within the context of the preferred embodiment of the present invention the semiconductor integrated circuit microelectronic fabrication whose schematic cross-sectional diagram is illustrated in FIG. 4. Shown in FIG. 5 is a schematic cross-sectional diagram of the semiconductor integrated circuit microelectronic fabrication at an early stage in its alternative fabrication in accord with the preferred embodiment of the present invention.

Shown in FIG. 5 is a schematic cross-sectional diagram of a semiconductor integrated circuit microelectronic fabrication otherwise generally analogous to the semiconductor integrated circuit microelectronic fabrication whose schematic cross-sectional diagram is illustrate in FIG. 3, but wherein in the alternative of forming interposed between the series of patterned pad oxide layers 22a, 22b, 22c, 22d and 22e having formed aligned thereupon the series of patterned silicon nitride layers 24a, 24b, 24c, 24d and 24e the series of thermally grown patterned silicon oxide layers 26a, 26b, 26c and 26d, there is instead formed within the silicon semiconductor substrate 20 while employing the series of patterned pad oxide layers 22a, 22b, 22c, 22d and 22e and the series of patterned silicon nitride layers 24a, 24b, 24c, 24d and 24e as a mask a series of round bottomed apertures 28a, 28b, 28c and 28d.

As is understood by a person skilled in the art, the series of round bottomed apertures 28a, 28b, 28c and 28d may be formed employing a reactive ion etch (RIE) etch method as is otherwise conventional in the art of semiconductor integrated circuit microelectronic fabrication, which will typically and preferably employ a chlorine containing etchant gas composition, but with an appropriate and timely addition of a sidewall passivation polymer forming material, such as a bromine containing sidewall passivation polymer forming material, to provide the round bottoms to the series of round bottomed apertures 28a, 28b, 28c and 28d. Typically and preferably, each of series of round bottomed apertures 28a, 28b, 28c and 28d is formed to a depth within the silicon semiconductor substrate 20 of from about 100 to about 1000 angstroms.

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein the semiconductor integrated circuit microelectronic fabrication has been thermally annealed to provide a series of thermally grown patterned silicon oxide aperture liner layers 30a, 30b, 30c and 30d within each of the series of round bottomed apertures 28a, 28b, 28c and 28d.

Within the preferred embodiment of the present invention, the series of thermally grown patterned silicon oxide aperture liner layers 30a, 30b, 30c and 30d may be formed employing a thermal annealing method generally analogous or equivalent to the thermal annealing method as employed for forming the series of thermally grown patterned silicon oxide layers 26a, 26b, 26c and 26d as illustrated within the schematic cross-sectional diagram of FIG. 3, but wherein there is formed a more limited thickness of the series of thermally grown patterned silicon oxide aperture liner layers 30a, 30b, 30c and 30d in comparison with the series of thermally grown patterned silicon oxide layers 26a, 26b, 26c and 26d, but nonetheless where the series of thermally grown patterned silicon oxide aperture liner layers 30a, 30b, 30c and 30d is also grown laterally beneath the series of patterned pad oxide layers 22a, 22b, 22c, 22d and 22e. Typically and preferably, each of the thermally grown patterned silicon oxide aperture liner layers 30a, 30b, 30c and 30d is formed to a thickness of from about 100 to about 1000 angstroms.

As is understood by a person skilled in the art, subsequent to forming the semiconductor integrated circuit microelectronic fabrication whose schematic cross-sectional diagram is illustrated in FIG. 6, there may also be sequentially stripped: (1) the series of patterned silicon nitride layers 24a, 24b, 24c, 24d and 24e from the series of patterned pad oxide layers 22a, 22b, 22c, 22d and 22e while employing an aqueous phosphoric acid etchant at an elevated temperature; and (2) the series of patterned pad oxide layers 22a, 22b, 22c, 22d and 22e, in conjunction with the series of thermally grown patterned silicon oxide aperture liner layers 30a, 30b, 30c and 30d, while employing a hydrofluoric acid etchant or a buffered oxide etchant, to also provide the semiconductor integrated circuit microelectronic fabrication whose schematic cross-sectional diagram is illustrated in FIG. 4, wherein the semiconductor integrated circuit microelectronic fabrication whose schematic cross-sectional diagram is illustrated in FIG. 4 comprises the silicon semiconductor substrate 20 having formed therein the corrugated region 20'.

Figure 7:
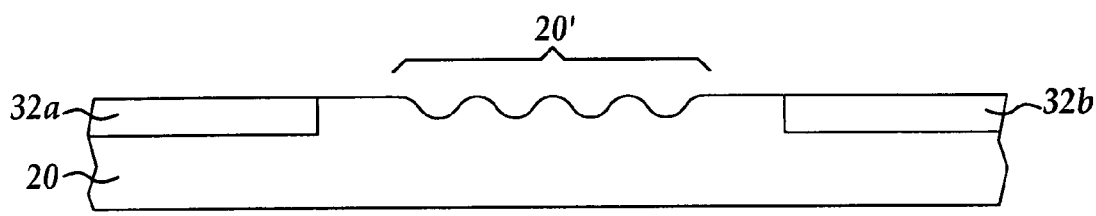

Referring now to FIG. 7, there is shown a schematic cross-sectional diagram illustrating the results of further processing of the semiconductor integrated circuit microelectronic fabrication whose schematic cross-sectional diagram is illustrated in FIG. 4.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed within the silicon semiconductor substrate 20 at a pair of peripheral regions which do not include the corrugated region 20' a pair of isolation regions 32a and 32b which longitudinally define an active region of the semiconductor substrate 20 having the corrugated region 20' of the silicon semiconductor substrate 20 contained therein.

Within the preferred embodiment of the present invention, the pair of isolation regions 32a and 32b may be formed employing methods and materials as are conventional in the art of semiconductor integrated circuit microelectronic fabrication (including but not limited to rounded corner methods as are disclosed within the references cited within the Description of the Related Art), to provide the pair of isolation regions 32a and 32b formed as isolation regions including but not limited to shallow trench isolation (STI) regions and local oxidation of silicon (LOCOS) isolation regions.

Similarly, and although the preferred embodiment of the present invention illustrates the present invention within the context of forming within the active region of the semiconductor substrate 20 the corrugated region 20' prior to forming the isolation regions 32a and 32b which isolate the active region of the semiconductor substrate 20 having formed therein the corrugated region 20', a reverse ordering for forming the isolation regions 32a and 32b and the corrugated region 20' within the active region of the semiconductor substrate 20 as defined by the isolation regions 32a and 32b is also within the context of the present invention.

Figure 8:
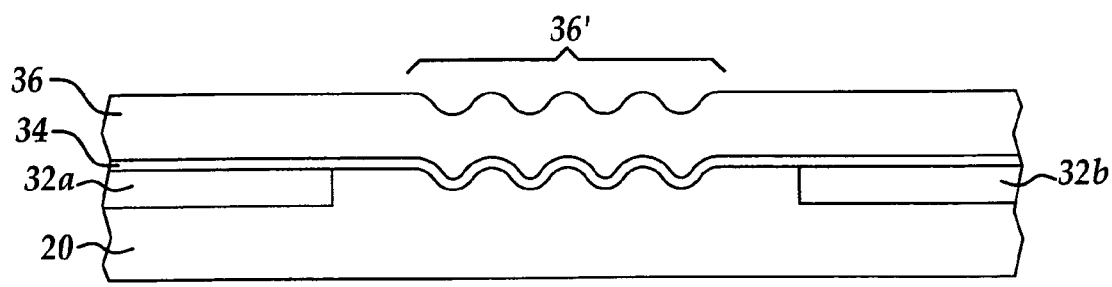

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein: (1) there is formed upon exposed portions of the isolation regions 32a and 32b and the active region of the semiconductor substrate 20 having the corrugated region 20' formed therein a gate dielectric layer 34 which replicates the corrugated region 20' within the active region of the silicon semiconductor substrate 20; and (2) there is formed upon the gate dielectric layer 34 a gate electrode 36 which further replicates the corrugated region 20' within the silicon semiconductor substrate 20 (while covering the interface thereof with the gate dielectric layer 34) to provide a replicated corrugated region 36' within an upper surface of the gate electrode 36.

Within the preferred embodiment of the present invention with respect to the gate dielectric layer 34, the gate dielectric layer 34 may be formed employing methods and materials as are conventional in the art of semiconductor integrated circuit microelectronic fabrication, including but not limited to gate dielectric layer thermal growth methods, and (as is more specifically illustrated within the schematic cross-sectional diagram of FIG. 8) gate dielectric layer deposition (and optional patterning) methods. Typically and preferably, the gate dielectric layer 34 is formed at least in part of a silicon oxide gate dielectric material, formed to a thickness of from about 8 to about 50 angstroms upon at least the active region of the silicon semiconductor substrate 20 laterally defined by the pair of isolation regions 32a and 32b.

Within the preferred embodiment of the present invention with respect to the gate electrode 36, the gate electrode 36 may similarly also be formed employing methods and materials as are conventional in the art of semiconductor integrated circuit microelectronic fabrication, including but not limited to metal, metal alloy, doped polysilicon (having a dopant concentration of greater than about 1E19 dopant atoms per cubic centimeter) and polycide (doped polysilicon/metal silicide stack) gate electrode materials. Typically and preferably the gate electrode 36 is formed of dimensions and of a placement analogous or equivalent to the dimensions and the placement of the gate electrode 14 as illustrated within the field effect transistor (FET) within the schematic isometric diagram of FIG. 1. Further in accord with the semiconductor integrated circuit microelectronic fabrication whose schematic isometric diagram is illustrated in FIG. 1, the gate electrode 36 may then be employed as a mask for forming within the active region of the semiconductor substrate 20 within areas not covered by the gate electrode 36 a pair of source/drain regions which are separated by the channel region within the active region of the semiconductor substrate which is covered by the gate electrode 36.

Upon forming the semiconductor integrated circuit microelectronic fabrication whose schematic isometric view diagram is illustrated in FIG. 1 or whose corresponding schematic cross-sectional diagram is illustrated in FIG. 8, there is formed a semiconductor integrated circuit microelectronic fabrication having formed therein a field effect transistor (FET) device, and preferably a metal oxide semiconductor field effect transistor (MOSFET) device, with enhanced performance within decreased semiconductor substrate area. The present invention realizes the foregoing object by employing when fabricating within the semiconductor integrated circuit microelectronic fabrication the field effect transistor (FET) device which comprises: (1) a semiconductor substrate; (2) a gate electrode formed over the semiconductor substrate and covering a channel region within the semiconductor substrate; and (3) a pair of source/drain regions formed within the semiconductor substrate and separated by the channel region within the semiconductor substrate: (1) an interface of the channel region covered by the gate electrode; and (2) an upper surface of the gate electrode, at least one of which is corrugated.

As is understood by a person skilled in the art, and in accord with the above, and although the preferred embodiment of the present invention illustrates the present invention within the context of a metal oxide semiconductor field effect transistor having an: (1) an interface of a channel region covered by a gate electrode; and (2) an upper surface of the gate electrode which covers the channel region, both of which are corrugated, the present invention requires only that at least one of: (1) the interface of the channel region covered by the gate electrode; and (2) the upper surface of the gate electrode, be corrugated.

To provide within the context of the present invention a field effect transistor (FET) device wherein only the interface of the channel region which is covered by the gate electrode is corrugated, there may simply be planarized the gate electrode 36 as illustrated within the schematic cross-sectional diagram of FIG. 8. Similarly, to provide within the context of the present invention a field effect transistor (FET) device wherein only the upper surface of the gate electrode is corrugated, the semiconductor substrate 20 as illustrated within the schematic cross-sectional diagram of FIG. 4 is provided absent the corrugated region 20' formed therein and a corrugated region is formed only within the upper surface of the gate electrode 36 as illustrated within the schematic cross-sectional diagram of FIG. 8 while employing methods as are generally employed for forming the corrugated region 20' within the silicon semiconductor substrate 20 as illustrated within the schematic cross-sectional diagram of FIG. 4.

With respect to the enhanced performance of the field effect transistor (FET) device fabricated in accord with the present invention, the enhanced performance is anticipated due to an increased effective channel length and/or gate electrode length (due to corrugation of the at least one of: (1) the interface of the channel region covered by the gate electrode; and (2) the upper surface of the gate electrode) within the field effect transistor (FET) device fabricated in accord with the present invention. Such is anticipated to provide an enhanced saturated drain current within the field effect transistor (FET) device in accord with the preferred embodiment of the present invention.

As is understood by a person skilled in the art, the preferred embodiment of the present invention is illustrative of the present invention rather than limiting of the present invention. Revisions and modifications may be made to methods, materials, structures and dimensions through which is provided a field effect transistor (FET) device and a method for fabricating the field effect transistor (FET) device in accord with the preferred embodiment of the present invention, while still providing a field effect transistor (FET) device and a method for fabricating the field effect transistor (FET) device in accord with the present invention, further in accord with the accompanying claims.

What is claimed is:

1. A field effect transistor (FET) device with enhanced performance within a decreased substrate area comprising;
   a semiconductor substrate comprising an active region defined by isolation regions;
   a gate electrode formed over a portion of the active region and at least a portion of the isolation regions to cover and define a channel region within the active region; and
   a pair of source/drain regions formed within the active region and separated by the channel region, wherein said FET device further comprises at least one of:
      a corrugated interface of the active region including said channel region, said corrugated interface comprising rounded valley bottom portions; and
      a corrugated upper surface of the gate electrode.

2. The field effect transistor (FET) device of claim 1 wherein the field effect transistor (FET) device is selected from the group consisting of metal oxide semiconductor field effect transistor (MOSFET) devices and metal semiconductor field effect transistor (MESFET) devices.

3. The field effect transistor (FET) device of claim 1 wherein the at least one of:
   the corrugated interface of the active region; and
   the corrugated upper surface of the gate electrode, is corrugated with a peak-to-peak longitudinal periodicity of from about 0.02 to about 0.4 microns and a peak-to-valley vertical depth of from about 100 to about 1000 angstroms.

4. A field effect transistor (FET) device comprising:
   a semiconductor substrate comprising an active region defined by isolation regions;
   a gate electrode formed over a portion of the active region and at least a portion of the isolation regions to cover and define a channel region within the active region; and
   a pair of source/drain regions formed within the active region and separated by the channel region, wherein an interface of the active region including the channel region is corrugated, said corrugated interface comprising rounded valley bottom portions and peak portions.

5. A field effect transistor (FET) device comprising:
a semiconductor substrate comprising an active region defined by isolation regions;
a gate electrode formed over a portion of the active region and at least a portion of the isolation regions to cover and define a channel region within the active region; and
a pair of source/drain regions formed within the active region and separated by the channel region within the active region, wherein an upper surface of the gate electrode is corrugated, said corrugated upper surface comprising rounded valley bottom portions.

6. The field effect transistor (FET) device of claim 1 wherein both the interface of the active region and the upper surface of the gate electrode are corrugated, said corrugated interface and said corrugated upper surface comprising rounded valley bottom portions and rounded peak portions.

7. The field effect transistor (FET) device of claim 1 wherein the gate electrode is formed to a thickness of from about 500 to about 2000 angstroms.

8. A method for forming a field effect transistor (FET) device comprising:
providing a semiconductor substrate comprising an active region defined by isolation regions;
forming a gate electrode over a portion of the active region and at least a portion of the isolation regions to cover and define a channel region within the active region; and
forming within the active region and separated by the channel region within the active region a pair of source/drain regions, wherein said FET device further comprises at least one of:
a corrugated interface of the active region including said channel region, said corrugated interface comprising rounded valley bottom portions; and
a corrugated upper surface of the gate electrode.

9. The method of claim 8 wherein the field effect transistor (FET) device is selected from the group consisting of metal oxide semiconductor field effect transistor (MOSFET) devices and metal semiconductor field effect transistor (MESFET) devices.

10. The method of claim 8 wherein the at least one of;
the corrugated interface of the active region; and
the corrugated upper surface of the gate electrode, is corrugated with a peak-to-peak longitudinal periodicity of from about 0.02 to about 0.4 microns and a peak-to-valley vertical depth of from about 100 to about 1000 angstroms.

11. A method for forming a field effect transistor (FET) device comprising:
providing a semiconductor substrate comprising an active region defined by isolation regions;
forming a gate electrode over a portion of the active region and at least a portion of the isolation regions to cover and define a channel region within the active region; and
forming a pair of source/drain regions within the active region and separated by the channel region within the active region wherein an interface of the active region is corrugated, said corrugated interface comprising rounded valley bottom portions and peak portions.

12. A method for forming a field effect transistor (FET) device comprising:
providing a semiconductor substrate comprising an active region defined by isolation regions;
forming a gate electrode over a portion of the active region and at least a portion of the isolation regions to cover and define a channel region within the active region; and
forming a pair of source/drain regions within the active region and separated by the channel region within the active region wherein an upper surface of the gate electrode is corrugated, said corrugated surface comprising rounded valley bottom portions.

13. The method of claim 8 wherein both the interface of the active region and the upper surface of the gate electrode are corrugated, said corrugated interface and said corrugated upper surface comprising rounded valley bottom portions and rounded peak portions.

14. The method of claim 8 wherein the gate electrode is formed to a thickness of from about 500 to about 2000 angstroms.

15. The field effect transistor (FET) device of claim 1 wherein the corrugated interface comprises silicon.

16. The field effect transistor (FET) device of claim 4 wherein the corrugated interface comprises silicon.

17. The field effect transistor (FET) device of claim 5 wherein the corrugated interface comprises silicon.

18. The method of claim 8 wherein the active region comprises silicon and the corrugated interface is formed by a method selected from the group consisting of oxidation and etching.

19. The method of claim 11 wherein the active region comprises silicon and the corrugated surface is formed by is formed by a method selected from the group consisting of oxidation and etching.

20. The method of claim 12 wherein the active region comprises silicon and the corrugated surface is formed by a method selected from the group consisting of oxidation and etching.

* * * * *